(12) United States Patent
Chen et al.

(10) Patent No.: US 9,473,164 B1
(45) Date of Patent: Oct. 18, 2016

(54) METHOD FOR TESTING ANALOG-TO-DIGITAL CONVERTER AND SYSTEM THEREFOR

(71) Applicant: FREESCALE SEMICONDUCTOR, INC., Austin, TX (US)

(72) Inventors: Tao Chen, Austin, TX (US); Xiankun Jin, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/751,804

(22) Filed: Jun. 26, 2015

(51) Int. Cl.
 *H03M 1/10* (2006.01)
 *H03M 1/46* (2006.01)
 *H03M 1/12* (2006.01)

(52) U.S. Cl.
 CPC ........... *H03M 1/468* (2013.01); *H03M 1/1071* (2013.01); *H03M 1/124* (2013.01)

(58) Field of Classification Search
 CPC .... H03M 1/804; H03M 1/68; H03M 1/1038; H03M 1/12; H03M 1/46; H03M 1/38; H03M 1/1071; H03M 1/462; H03M 1/1047; H03M 1/00; H03M 1/144; H03M 1/162; H03M 2201/657; H03M 1/069; H03M 1/1009
 USPC ................................ 341/118, 120, 155, 172
 See application file for complete search history.

(56) References Cited

U.S. PATENT DOCUMENTS

| | | | | |
|---|---|---|---|---|
| 4,599,604 A | * | 7/1986 | McKenzie | H03M 1/1057 341/120 |
| 4,970,514 A | * | 11/1990 | Draxelmayr | H03M 1/1042 324/130 |
| 6,720,903 B2 | | 4/2004 | Confalonieri et al. | |
| 6,731,232 B1 | * | 5/2004 | Kearney | H03M 1/129 341/144 |
| 7,271,758 B2 | | 9/2007 | Piasecki et al. | |
| 7,408,490 B2 | * | 8/2008 | Melanson | H03M 1/1033 341/120 |
| 7,868,796 B2 | * | 1/2011 | Berens | H03M 1/1038 341/120 |
| 8,035,622 B2 | | 10/2011 | Hotelling et al. | |
| 8,547,270 B1 | * | 10/2013 | Strode | H03M 1/1061 341/155 |
| 2008/0100484 A1 | * | 5/2008 | Variyam | H03M 1/1028 341/120 |
| 2011/0122006 A1 | * | 5/2011 | Liao | H03M 1/1047 341/120 |
| 2013/0082853 A1 | * | 4/2013 | Muhammad | H03M 1/201 341/118 |

OTHER PUBLICATIONS

Jin, "Low-cost high-quality constant offset injection for SEIR-based ADC built-in-self-test", IEEE International Symposium on Circuits and Systems (ISCAS), Jun. 1-5, 2014, pp. 285-288, Melbourne VIC.

* cited by examiner

Primary Examiner — Linh Nguyen

(57) ABSTRACT

A data processing system having an analog-to-digital converter (ADC) and method for testing the ADC are provided. The data processing system also comprises a digital-to-analog converter (DAC) and test logic. The DAC has a first voltage range, an input for receiving a test code, and an output. The ADC has a second voltage range larger than the first voltage range, an input coupled to the output of the DAC, and an output for providing a series of output codes over the second voltage range. The test logic is coupled to the ADC and is for controlling testing of the ADC using the DAC. A plurality of series of test codes are provided to the DAC for testing portions of the second voltage range output from the ADC. A beginning series of test codes is for testing a beginning portion of the second voltage range and subsequent series of test codes are for testing subsequent portions of the second voltage range. Subsequent portions of the second voltage range are tested until a maximum voltage of the second voltage range of the ADC is reached.

19 Claims, 3 Drawing Sheets

METHOD FOR TESTING ANALOG-TO-DIGITAL CONVERTER AND SYSTEM THEREFOR

BACKGROUND

1. Field

This disclosure relates generally to test methods and systems, and more specifically, to methods and systems for testing analog-to-digital converters.

2. Related Art

Many of today's system on chip (SoC) devices include converters such as an analog-to-digital converter (ADC). An ADC generally samples received analog voltages and converts the sampled voltages into digital values. The resolution or precision of an ADC is typically dependent upon the application of SoCs. For example, if the ADC was used to determine a temperature in a consumer temperature sensing application, then a typical resolution might be 8 bits. Higher resolution ADCs require higher precision and are generally more sensitive to environmental conditions such as circuit noise, temperature, operating voltages, and so on.

Traditionally, ADCs are tested by providing test input voltages representing each of the conversion result values. To account for noise and to precisely calculate the error, the test input voltage is varied in multiple steps in the range of each conversion result value. Because this test technique is time consuming, which leads to prolonged test times and requires expensive test equipment, it is desirable to perform ADC testing within a system or application to assist in system debug efforts, for example.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present disclosure includes a method and system which accommodates testing of an analog-to-digital converter (ADC) using a digital-to-analog converter (DAC) which has a smaller output voltage range than the ADC input voltage range. For example, the ADC may have a 3 volt input voltage range and the DAC may have a 1.5 volt output voltage range. Because the DAC has an output voltage range less than an input voltage range of the ADC, a portion of the ADC voltage range may be tested by selectively coupling capacitors in the capacitor array of the ADC to a reference voltage VREF. Capacitors selectively coupled to VREF during a sampling phase of the ADC operation allow an offset voltage to be added to the DAC output voltages.

Figure 1:
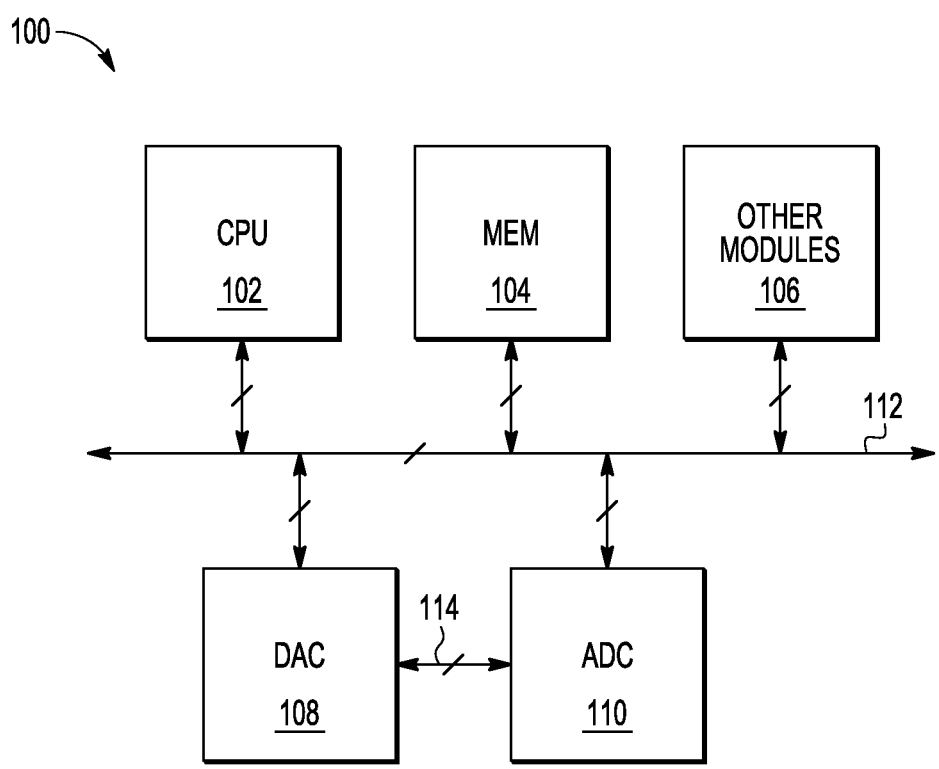
FIG. 1 is a simplified block diagram illustrating a data processing system according to an embodiment of the present disclosure.

FIG. 1 is a simplified block diagram illustrating a data processing system 100 according to an embodiment of the present disclosure. In some embodiments, data processing system 100 may be implemented as a single integrated circuit. In some embodiments, data processing system 100 may be implemented as a plurality of integrated circuits, or may be implemented as a combination of integrated circuits and discrete components. Alternate embodiments may implement system 100 in any manner.

In the embodiment illustrated in FIG. 1, data processing system 100 includes a central processing unit (CPU) 102, memory 104, other modules 106, a digital-to-analog converter (DAC) 108, and analog-to-digital converter (ADC) 110, which are all bi-directionally coupled to each other by way of a system bus 112. The DAC 108 and the ADC 110 are also coupled to each other via bus 114. In some embodiments, system 100 may include fewer, more, or different blocks of circuitry than those illustrated in FIG. 1.

Figure 2:
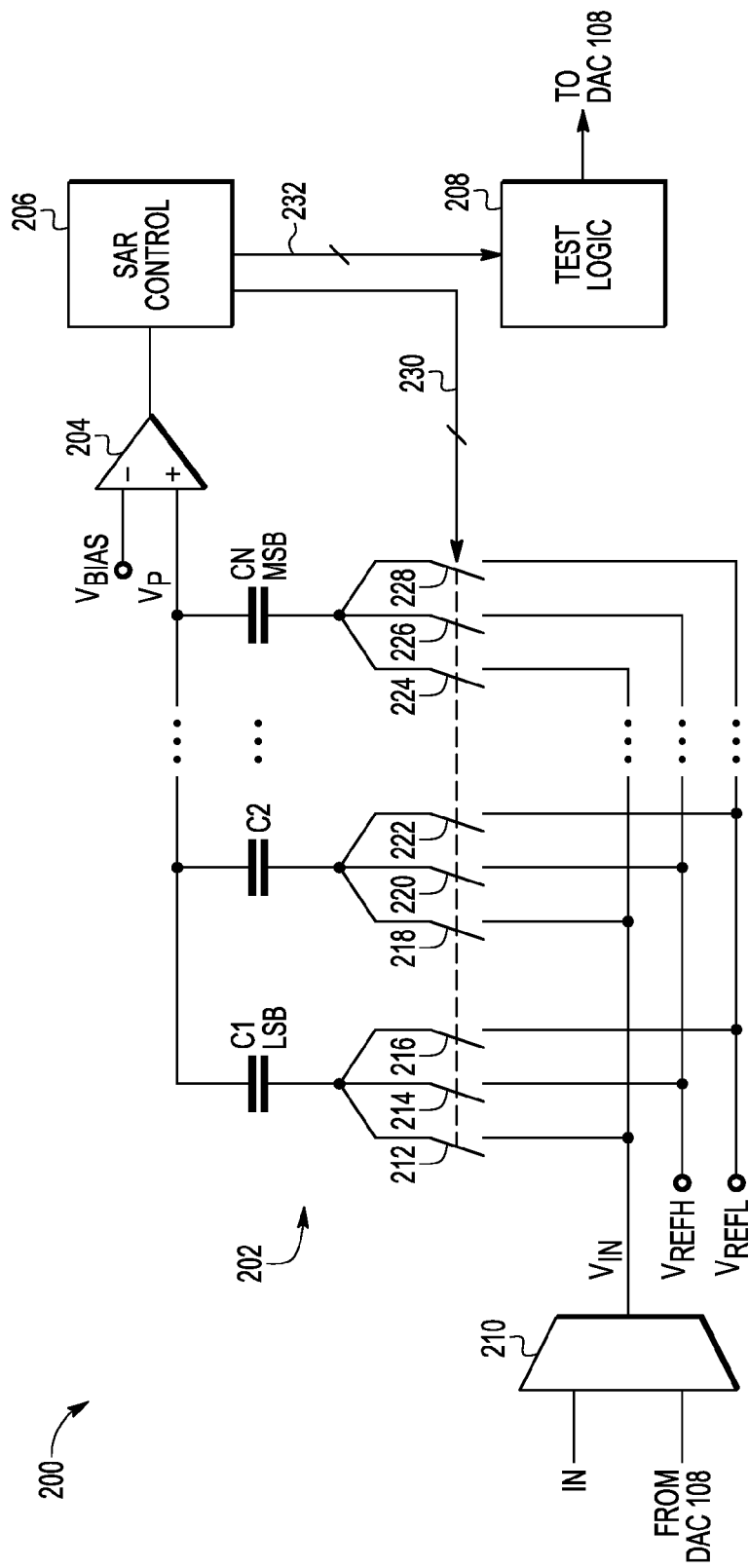
FIG. 2 is simplified schematic diagram illustrating an exemplary successive approximation register (SAR) ADC according to an embodiment of the present disclosure.

FIG. 2 is a simplified schematic diagram illustrating an exemplary successive approximation register (SAR) ADC 200 according to an embodiment of the present disclosure. SAR ADC 200 depicts representative circuitry of ADC 110 in FIG. 1 and includes a capacitor array 202, a comparator 204, an SAR control unit 206, test logic 208, a multiplexer 210, and switches 212-228.

Capacitor array 202 includes a plurality of binary-weighted capacitors C1-CN, where N is the number of bits of resolution of the ADC. For example, capacitor array 202 may include binary-weighted capacitors C1-C12 for a 12-bit resolution ADC. In some embodiments, the capacitor array may be a two-stage weighted capacitor array, a C-2C ladder capacitor array, or any suitable form of a capacitor array sufficient for an SAR ADC.

In this embodiment, C1 is characterized as the least significant bit (LSB) capacitor and CN is characterized as the most significant bit (MSB) capacitor. A dummy capacitor (not shown) is included in the capacitor array and has equal value as the LSB capacitor. Each capacitor C1-CN has a first terminal and a second terminal whereby capacitors C1-CN are coupled between switches 212-228 and a first input of comparator 204. Switches 212, 218, and 224 selectively couple the first terminal of each capacitor C1-CN of the capacitor array 202 to a voltage VIN provided at an output of the multiplexer 210. Switches 214, 220, and 226 selectively couple the first terminal of each capacitor C1-CN of the capacitor array 202 to first voltage reference node VREFH. Switches 216, 222, and 228 selectively couple the first terminal of each capacitor C1-CN of the capacitor array 202 to second voltage reference node VREFL. The second terminal of each capacitor C1-CN is coupled to the first input of comparator 204 (node VP).

Comparator 204 includes the first input coupled to receive a voltage VP at node VP coupled to the second terminal of the capacitors C1-CN, a second input coupled to receive a reference voltage VBIAS at a VBIAS supply terminal, and an output for providing a digital indication of whether the voltage at the first input is higher or lower than the voltage at the second input. In this embodiment, comparator 204 is characterized as a differential comparator and compares the voltage VP with the reference voltage VBIAS. For example, when VP is lower than VBIAS, the output of comparator 204 can be at a logic low level, and when VP is higher than VBIAS, the output of comparator 204 can be at a logic high level.

SAR control unit 206 is coupled to receive the digital indication from comparator 204 of whether VP is at a higher voltage or lower voltage than VBIAS. SAR control unit 206 sequentially determines the value of bits based on the indication from comparator 204 and stores the results in a register, memory, or the like. For example, in an 8-bit resolution ADC, a first bit value may be determined in a first clock cycle and stored, and a second bit value may be determined in a second clock cycle and stored, and so on until all eight bit values have been determined and stored. The SAR control unit 206 is coupled to provide signals via bus 230 for controlling switches 212-228 and is coupled to test logic block 208 via bus 232 whereby a pass or fail can be determined based on the stored results.

Test logic block 208 of SAR ADC 200 communicates with the DAC 108 in FIG. 1 via bus 114. For example, test logic block 208 may provide a series of test codes to the DAC 108 and the DAC 108, in turn, outputs voltages for testing a portion of the voltage range of the ADC 200. The test logic block 208 may be used to determine a pass/fail result from an ADC conversion corresponding to a test code sent to the DAC 108.

Multiplexer 210 couples an output of DAC 108 in FIG. 1 to capacitor array 202 during a test mode. Multiplexer 210 includes a first input IN for receiving an analog voltage during normal operation of the SAR ADC 200, a second input for receiving an analog voltage from DAC 108 during a test mode, and an output for providing an input voltage VIN to the capacitor array 202 via switches 212, 218, and 224. Multiplexer 210 receives a control signal (not shown) to select one of the first input or the second input to be coupled to the output.

During a sample phase of the ADC 110, voltage at node VIN is sampled on binary-weighted capacitors C1-CN in the capacitor array 202 via switches 212, 218, and 224. After the voltage at node VIN is sampled on binary-weighted capacitors C1-CN in the capacitor array 202, switches 212, 218, and 224 are opened in a hold phase. In a conversion phase, charge on each binary-weighted capacitor is successively redistributed and compared with a reference voltage VBIAS at comparator 204, converting the sampled voltage to a digital value.

Figure 3:
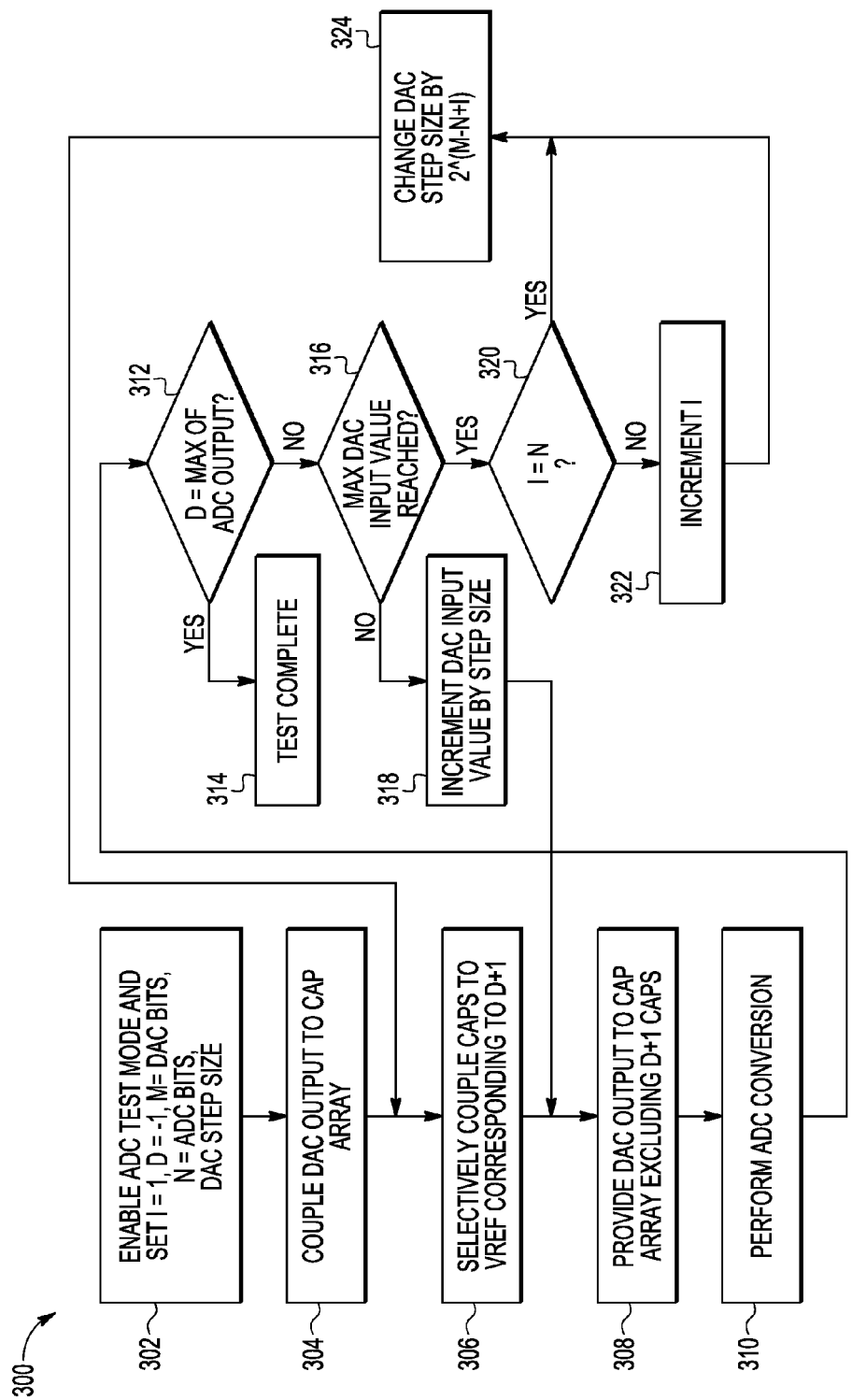
FIG. 3 is a simplified flow chart illustrating an exemplary method for testing an ADC using a DAC according to an embodiment of the present disclosure.

FIG. 3 is a simplified flow chart illustrating an exemplary method for testing an ADC using a DAC according to an embodiment of the present disclosure. In this embodiment, DAC 108 has a voltage range which is less than a voltage range of ADC 110 and is coupled to provide a range of voltages to an input of ADC 110 via bus 114 during a test mode. The DAC 108 receives input codes such as test codes, commands, or the like, and in turn outputs corresponding analog voltages. The DAC 108 output voltages are provided to the ADC 110 during the test mode. The ADC 110 samples the provided voltages and through a conversion process, generates digital output codes. The ADC 110 may store the output codes in memory, registers, or the like, and may provide the output codes to functional blocks such as test logic unit 208, for example.

At step 302, an ADC test mode is enabled. In some embodiments, variables may be set or reset to initial values for a test procedure. For example, a procedure to test an ADC using a DAC may include initial settings of variables such as an iteration number I set to I=1, a DAC resolution set to 12 bits, a DAC step size set to 1, an ADC resolution set to 12 bits, an ADC maximum output code D set to 1, and so on.

At step 304, a DAC output is coupled to a capacitor array of the ADC. In this embodiment, capacitor array 202 includes a plurality of binary-weighted capacitors C1-CN, where N is the number of bits of resolution of the ADC 110. In some embodiments, the capacitor array 202 may be a two-stage weighted capacitor array, a C-2C ladder capacitor array, or any suitable form of a capacitor array sufficient for an SAR ADC. In this embodiment, DAC 108 is coupled to provide voltages to an input of ADC 110 via bus 114 during the ADC test mode. Switches 212, 218, and 224 selectively couple the first terminal of each capacitor C1-CN of the capacitor array 202 to the input of ADC 110. A series of test codes are provided to the DAC 108. The DAC 108 in turn outputs a test voltage corresponding to each test code.

In this embodiment, the DAC 108 output voltage is ramped or increased sequentially to test the ADC 110. For example using an M-bit DAC 108, input test codes may be increased sequentially from 0 to 2^M−1. In this example, a 12-bit DAC 108 having a 1.5 volt range may be considered. When a first test code of 0000 (decimal) is provided to the DAC 108, a corresponding voltage of 0 volts (0000*(1.5 volts/2^12 codes)) may be output from the DAC 108. When a second test code of 0001 (decimal) is provided to the DAC 108, a corresponding voltage of 0.366 millivolts (0001*(1.5 volts/2^12 codes)) may be output. When a third test code of 0002 (decimal) is provided to the DAC 108, a corresponding voltage of 0.732 millivolts (0002*(1.5 volts/2^12 codes)) may be output, and so on until a last test code of 4095 (decimal) is provided to the DAC 108 whereby a corresponding voltage of 1.50 volts (4095*(1.5 volts/2^12 codes)) may be output. In some embodiments, the DAC 108 output voltage may be decreased sequentially to test the ADC 110. In some embodiments, portions of the DAC 108 output voltage range may be used to test the ADC 110.

At step 306, one or more capacitors in the capacitor array of the ADC 110 are selectively coupled to a reference voltage (VREF) supply. In some embodiments, the reference voltage VREF may include VREFH or VREFL shown in FIG. 2. Because the DAC 108 has a voltage range less than a voltage range of the ADC 110, a portion of the ADC 110 voltage range may be tested by selectively coupling capacitors in the capacitor array 202 to the reference voltage VREF. For example, when an M-bit DAC having 1.5 volt range is used to test an N-bit ADC having a 3.0 volt range, the DAC input code may be increased sequentially from 0 to 2^M−1 in a first iteration outputting a voltage that increases substantially linearly. In this example, about a one-half portion of the ADC 110 voltage range may be tested. The series of DAC input codes may be representative of a linear signal having a slope determined to test about one-half of the voltage range of the ADC. To test one or more next portions of the ADC 110 voltage range, capacitors are selectively coupled to VREF in subsequent iterations such that an offset voltage is added to the DAC 108 output voltages. For example, the last DAC 108 voltage of the tested one-half portion may correspond to the last converted ADC 110 output code D=2048. To test the next one-fourth portion of the ADC 110 voltage range, capacitors C1 (LSB) and CN (MSB) may be coupled to VREF in a second iteration causing the DAC 108 to output voltages corresponding to ADC 110 output codes 2049-3072. To test the next one-eighth portion of the ADC 110 voltage range, capacitors C1 (LSB), CN-1, and CN (MSB) may be coupled to VREF in a third iteration causing the DAC 108 to output voltages corresponding to ADC 110 output codes 3073-3584, and so on.

At step 308, the DAC 108 output voltage is provided, during a sampling phase of the ADC 110, to the plurality of binary weighted capacitors of the capacitor array 202 excluding capacitors coupled to the VREF supply. The DAC 108 output test voltage corresponds to the test codes provided to the DAC 108. Referring back to FIG. 2, in the test mode, multiplexer is configured to allow output voltage from DAC 108 to be coupled to VIN, and switches 212, 218, and 224 selectively couple VIN to capacitors of the capacitor array. For example, the DAC 108 output voltage may not be provided to capacitors C1 and CN in the ADC 110 D+1 output code example above because C1 and CN may be coupled to VREF.

At step 310, ADC 110 conversion is performed on a sampled voltage. For example, during an ADC conversion phase, charge on each binary-weighted capacitor is successively redistributed and compared with a reference voltage VBIAS at comparator 204, converting the sampled voltage to a digital value or ADC output code.

At step 312, determine if the ADC 110 output code D has reached a maximum. If the ADC 110 output code D has reached a maximum (yes), then the test is complete at step 314. If the ADC 110 output code D has not reached a maximum (no), then determine if a maximum DAC 108 input value has been reached at step 316. In some embodiments, a maximum ADC 110 output code for a portion of the ADC 110 output codes may be determined such as when testing a portion of the ADC 110 voltage range, for example. In some embodiments, a minimum ADC 110 output code may be determined at step 312, for example, when testing the ADC 110 using the DAC 108 having a ramp voltage that is characterized as a decreasing ramp voltage.

At step 316, determine if the DAC 108 input code has reached a maximum. The DAC 108 output voltages correspond to the input codes provided to the DAC 108. When a maximum input code is provided to the DAC 108, the DAC 108 may output a corresponding maximum voltage. For example, considering a 12-bit DAC having 1.5 volt range, the maximum input code may be 4095 (decimal) and may correspond to an output voltage of 1.5 volts. If the DAC 108 input code has not reached a maximum (no), then increment DAC 108 input value by step size at step 318. If the DAC 108 input code has reached a maximum (yes), then determine if the increment value I equals the ADC resolution bits (I=N) at step 320. In some embodiments, a maximum DAC input code for a portion of the possible DAC input codes may be determined such as when testing a portion of the ADC 110 voltage range, for example. In some embodiments, a minimum DAC 108 input code may be determined at step 316, for example, when testing the ADC 110 using the DAC 108 having a ramp voltage that is characterized as a decreasing ramp voltage.

At step 318, the DAC 108 input code is incremented by a step size. If the DAC 108 input code has not reached a maximum input code at step 316, then increment DAC 108 input code according to the step size and return at step 308. For example, an input code of 0010 (decimal) may be provided to the DAC 108, and after incrementing, the input code may be at 0012 (decimal) according to a step size of 2.

At step 320, determine if the iteration number I equals the number of ADC bits of resolution N. If the DAC 108 input code has reached a maximum at step 316, then determine if the iteration number I has reached the number of ADC bits of resolution N. An iteration generally refers to the process of providing a set of input codes to the DAC whereby corresponding output voltages are provided to test a portion of the voltage range of the ADC. For example, a first iteration may correspond to input codes provided to the DAC which begin at a minimum code and end at a maximum code. Considering a 12-bit DAC having 1.5 volt range, the minimum input code may be 0000 (decimal) and may correspond to an output voltage of 0 volts, and the maximum input code may be 4095 (decimal) and may correspond to an output voltage of 1.5 volts. In some embodiments, the size of the portion of the voltage range of the ADC may be determined by the selected coupling of one or more capacitors of the plurality of binary-weighted capacitors. In some embodiments, the slope of a ramped signal resulting from a series of test codes may be determined by a step size between DAC input codes of the series of test codes.

Because the DAC 108 has a voltage range less than a voltage range of the ADC 110, more than one iteration of the DAC input code may be required to test the voltage range of the ADC 110. The first iteration (1=1) may allow the DAC to be used to test a first portion of the ADC 110 voltage range. For example, the first iteration may include a series of test codes provided to the DAC which in turn outputs corresponding output voltages from 0 volts through 1.5 volts representative of a linear signal having a slope determined to test about a one-half portion of a 12-bit ADC having a 3.0 volt input voltage range. To test a second and subsequent portions of the ADC 110 voltage range, capacitors may be selectively coupled to VREF in the second and subsequent iterations such that an offset voltage is added to the DAC 108 output voltages. For example, the second iteration (1=2) may include a series of test codes provided to the DAC 108 which in turn outputs corresponding output voltages from approximately 1.5 volts through 2.25 volts and may be representative of a linear signal having a slope determined to test about a one-fourth additional portion of the 12-bit ADC 110 having a 3.0 volt input voltage range. A third iteration (1=3) may include a series of test codes provided to the DAC 108 which in turn outputs corresponding output voltages from approximately 2.25 volts through 2.375 volts and may be representative of a linear signal having a slope determined to test about a one-eighth additional portion of the ADC 110 input voltage range. A fourth iteration (1=4) may include DAC 108 output voltages to test about a one-sixteenth additional portion of the ADC 110, a fifth iteration (1=5) may include DAC 108 output voltages to test about a one-thirty-second additional portion of the ADC 110, and so on through a twelfth iteration (I=N=12) beyond which no further binary-weighted capacitors can be selectively coupled to VREF. The accumulative range of the DAC 108 output voltages over iterations 1 through 12 can be used to test the entire input voltage range of ADC 110 by testing 4096 out of a possible 4096 ADC output codes in the foregoing example.

If the iteration number I does not equal the number of ADC bits of resolution N (no), then increment the iteration number I at step 322 and continue at step 324. If the iteration number I equals the number of ADC bits of resolution N (yes), then change the DAC step size according to $2^{(M-N+1)}$ at step 324.

At step 322, the DAC 108 input code step size is incremented. If the DAC 108 input code has not reached a maximum input code at step 316, then increment DAC 108 input code step size and return at step 308. For example, the DAC 108 input code step size may initially be at 1 whereby each input code may be increased by 1. After incrementing the input code step size to 2, each input code may be increased by 2, effectively skipping every other input code.

At step 324, change the DAC step size by $2^{(M-N+1)}$. If the iteration number I equals the number of ADC bits of resolution N at step 320 or if the iteration number was incremented at step 322, then the DAC step size may be changed according to $2^{(M-N+1)}$. For example, the DAC 108 step size may initially be at 1 whereby each input code may be increased by 1. After incrementing the step size to 2, each input code may be increased by 2, effectively skipping every other input code. After the DAC 108 step size is changed according to $2^{(M-N+1)}$, then continue at step 306.

The following are various embodiments of the present invention.

Generally, there is provided, a method of testing an analog-to-digital converter (ADC) having a plurality of binary-weighted capacitors including: coupling an output of a digital-to-analog converter (DAC) to the plurality of binary-weighted capacitors, the DAC having a voltage range that is less than a voltage range of the ADC; providing a series of test codes to the DAC, the series of test codes for testing a portion of the voltage range of the ADC; outputting a test voltage corresponding to the test codes from the DAC to the plurality of binary-weighted capacitors during a sampling phase of the ADC; determining an output code from the test voltage during an ADC conversion phase; selectively coupling one or more capacitors of the plurality of binary-weighted capacitors, corresponding to a next portion of the ADC to be tested, to a reference voltage; and iteratively performing the steps of providing, outputting, determining, and selectively coupling until testing of the voltage range of the ADC is complete. Providing a series of test codes may further include providing a series of test codes during a first iteration, the series of test codes representative of a linear signal having a slope determined to test about one-half of the voltage range of the ADC. Providing a series of test codes may further include providing a series of test codes during a second iteration, the series of test codes representative of a linear signal having a slope determined to test an additional one-quarter of the voltage range of the ADC. Outputting a test voltage corresponding to the test codes from the DAC to the plurality of binary-weighted capacitors during a sampling phase of the ADC may further include outputting the test voltage corresponding to the test codes from the DAC to the plurality of binary-weighted capacitors excluding the one or more capacitors of the plurality of binary-weighted capacitors corresponding to a beginning test code of the next portion of the ADC to be tested. The ADC may be characterized as being a successive approximation register (SAR) ADC. Providing a series of test codes to the DAC, the series of test codes for testing a portion of the voltage range of the ADC, may further include providing a series of test codes for testing a portion of the voltage range of the ADC, a size of the portion determined by the selected coupling of one or more capacitors of the plurality of binary-weighted capacitors. Outputting a test voltage corresponding to the test codes from the DAC may further include outputting a voltage that increases substantially linearly. Testing of the voltage range of the ADC may be complete when a maximum voltage of an ADC input range is reached. Determining an output code from the test voltage during an ADC conversion phase may further include comparing a voltage from the plurality of binary-weighted capacitors with a reference voltage.

In another embodiment, there is provided, a method of testing a successive approximation register analog-to-digital converter (SAR ADC) having a plurality of binary-weighted capacitors including: coupling an output of a digital-to-analog converter (DAC) to the plurality of binary-weighted capacitors, the DAC having a voltage range that is less than a voltage range of the SAR ADC; providing a series of test codes to the DAC, the series of test codes representing a substantially linear voltage change over time, the series of test codes for testing a portion of the voltage range of the SAR ADC; outputting a test voltage corresponding to the test codes from the DAC to the plurality of binary-weighted capacitors during a sampling phase of the SAR ADC; determining an output code from the test voltage during a SAR ADC conversion phase; selectively coupling one or more capacitors of the plurality of binary-weighted capacitors, corresponding to a next portion of the SAR ADC to be tested, to a reference voltage; and iteratively performing the steps of providing, outputting, determining, and selectively coupling until testing of the voltage range of the SAR ADC is complete. The voltage range of the DAC may be further characterized as being an output voltage range and the voltage range of the ADC may be further characterized as being an input voltage range. Outputting a test voltage corresponding to the test codes from the DAC to the plurality of binary-weighted capacitors during a sampling phase of the SAR ADC may further include outputting the test voltage corresponding to the test codes from the DAC to the plurality of binary-weighted capacitors excluding the one or more capacitors of the plurality of binary-weighted capacitors corresponding to a beginning test code of the next portion of the SAR ADC to be tested. Determining an output code from the test voltage during an SAR ADC conversion phase may further include comparing a voltage from the plurality of binary-weighted capacitors with a reference voltage. Providing a series of test codes to the DAC, the series of test codes representing a substantially linear voltage changing over time may further include the substantially linear voltage increasing over time. Testing of the voltage range of the SAR ADC may be complete when a maximum voltage of an SAR ADC output voltage is reached. Providing a series of test codes may further include providing a series of test codes during a first iteration, the series of test codes may have a slope determined to test about one-half of the voltage range of the SAR ADC, and during a second iteration, the series of test codes may have a slope determined to test an additional one-quarter of the voltage range of the SAR ADC.

In yet another embodiment, there is provided, a data processing system including: a digital-to-analog converter (DAC) having a first voltage range, the DAC having an input for receiving a test code, and an output; an analog-to-digital converter (ADC) having a second voltage range larger than the first voltage range, the ADC having an input coupled to the output of the DAC, and an output for providing a plurality of output codes representative of the second voltage range; and test logic coupled to the ADC, the test logic for controlling testing of the ADC using the DAC for testing portions of the second voltage range of the ADC, wherein a beginning portion of a series of test codes provided to the DAC is for testing a beginning portion of the second voltage range and subsequent portions of the series of test codes is for testing subsequent portions of the second voltage range, and wherein the subsequent portions of the second voltage range are tested until testing of all of the second voltage range of the ADC is complete. The ADC may be characterized as being a successive approximation register ADC. The series of test codes may be representative of a ramped signal having a slope determined by a step size between test codes of the series of test codes. The data processing system may be implemented on a single integrated circuit.

By now it should be appreciated that there has been provided a method and system which accommodates testing of an analog-to-digital converter (ADC) using a digital-to-analog converter (DAC) which has a smaller output voltage range than the ADC input voltage range. Because the DAC has an output voltage range less than an input voltage range of the ADC, a portion of the ADC voltage range may be tested by selectively coupling capacitors in the capacitor array to a reference voltage VREF. Capacitors selectively coupled to VREF during a sampling phase of the ADC operation allow an offset voltage to be added to the DAC output voltages.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different data processing systems. For example, although FIG. 1 and the discussion thereof describe an exemplary data processing system, this exemplary system is presented merely to provide a useful reference in discussing various aspects of the invention. Of course, the description of the system has been simplified for purposes of discussion, and it is just one of many different types of appropriate system that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the systems depicted herein are merely exemplary, and that in fact many other system can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of testing an analog-to-digital converter (ADC) having a plurality of binary-weighted capacitors, the method comprising:
coupling an output of a digital-to-analog converter (DAC) to the plurality of binary-weighted capacitors, the DAC having a voltage range that is less than a voltage range of the ADC;

providing a series of test codes to the DAC, the series of test codes for testing a portion of the voltage range of the ADC;

outputting a test voltage corresponding to the test codes from the DAC to the plurality of binary-weighted capacitors during a sampling phase of the ADC;

determining an output code from the test voltage during an ADC conversion phase;

selectively coupling one or more capacitors of the plurality of binary-weighted capacitors, corresponding to a next portion of the ADC to be tested, to a reference voltage; and iteratively performing the steps of providing, outputting, determining, and selectively coupling until testing of the voltage range of the ADC is complete;

wherein providing a series of test codes further comprises providing a series of test codes during a first iteration, the series of test codes representative of a linear signal having a slope determined to test about one-half of the voltage range of the ADC.

2. The method of claim 1, wherein providing a series of test codes further comprises providing a series of test codes during a second iteration, the series of test codes representative of a linear signal having a slope determined to test an additional one-quarter of the voltage range of the ADC.

3. The method of claim 1, wherein outputting a test voltage corresponding to the test codes from the DAC to the plurality of binary-weighted capacitors during a sampling phase of the ADC further comprises outputting the test voltage corresponding to the test codes from the DAC to the plurality of binary-weighted capacitors excluding the one or more capacitors of the plurality of binary-weighted capacitors corresponding to a beginning test code of the next portion of the ADC to be tested.

4. The method of claim 1, wherein the ADC is characterized as being a successive approximation register (SAR) ADC.

5. The method of claim 1, wherein providing a series of test codes to the DAC, the series of test codes for testing a portion of the voltage range of the ADC, further comprises providing a series of test codes for testing a portion of the voltage range of the ADC, a size of the portion determined by the selected coupling of one or more capacitors of the plurality of binary-weighted capacitors.

6. The method of claim 1, wherein outputting a test voltage corresponding to the test codes from the DAC further comprises outputting a voltage that increases substantially linearly.

7. The method of claim 1, wherein testing of the voltage range of the ADC is complete when a maximum voltage of an ADC input range is reached.

8. The method of claim 1, wherein determining an output code from the test voltage during an ADC conversion phase further comprises comparing a voltage from the plurality of binary-weighted capacitors with a reference voltage.

9. A method of testing a successive approximation register analog-to-digital converter (SAR ADC) having a plurality of binary-weighted capacitors, the method comprising:

coupling an output of a digital-to-analog converter (DAC) to the plurality of binary-weighted capacitors, the DAC having a voltage range that is less than a voltage range of the SAR ADC;

providing a series of test codes to the DAC, the series of test codes representing a substantially linear voltage change over time, the series of test codes for testing a portion of the voltage range of the SAR ADC;

outputting a test voltage corresponding to the test codes from the DAC to the plurality of binary-weighted capacitors during a sampling phase of the SAR ADC;

determining an output code from the test voltage during a SAR ADC conversion phase;

selectively coupling one or more capacitors of the plurality of binary-weighted capacitors, corresponding to a next portion of the SAR ADC to be tested, to a reference voltage; and iteratively performing the steps of providing, outputting, determining, and selectively coupling until testing of the voltage range of the SAR ADC is complete;

wherein providing a series of test codes includes providing a series of test codes during a first iteration, wherein the series of test codes having a slope determined to test about one-half of the voltage range of the SAR ADC.

10. The method of claim 9, wherein the voltage range of the DAC is further characterized as being an output voltage range and the voltage range of the ADC is further characterized as being an input voltage range.

11. The method of claim 9, wherein outputting a test voltage corresponding to the test codes from the DAC to the plurality of binary-weighted capacitors during a sampling phase of the SAR ADC further comprises outputting the test voltage corresponding to the test codes from the DAC to the plurality of binary-weighted capacitors excluding the one or more capacitors of the plurality of binary-weighted capacitors corresponding to a beginning test code of the next portion of the SAR ADC to be tested.

12. The method of claim 9, wherein determining an output code from the test voltage during an SAR ADC conversion phase further comprises comparing a voltage from the plurality of binary-weighted capacitors with a reference voltage.

13. The method of claim 9, wherein providing a series of test codes to the DAC, the series of test codes representing a substantially linear voltage changing over time further comprises the substantially linear voltage increasing over time.

14. The method of claim 9, wherein testing of the voltage range of the SAR ADC is complete when a maximum voltage of an SAR ADC output voltage is reached.

15. The method of claim 9, wherein during a second iteration, the series of test codes having a slope determined to test an additional one-quarter of the voltage range of the SAR ADC.

16. A data processing system, comprising:

a digital-to-analog converter (DAC) having a first voltage range, the DAC having an input for receiving a test code, and an output;

an analog-to-digital converter (ADC) having a second voltage range larger than the first voltage range, the ADC having an input coupled to the output of the DAC, and an output for providing a plurality of output codes representative of the second voltage range; and test logic coupled to the ADC, the test logic for controlling testing of the ADC using the DAC for testing portions of the second voltage range of the ADC, wherein a beginning portion of a series of test codes provided to the DAC is for testing a beginning portion of the second voltage range and subsequent portions of the series of test codes is for testing subsequent portions of the second voltage range, and wherein the subsequent portions of the second voltage range are tested until testing of all of the second voltage range of the ADC is complete;

wherein a beginning portion of a series of test codes provided to the DAC includes a series of test codes provided during a first iteration, wherein the series of test codes has a slope determined to test about one-half of the second voltage range.

17. The data processing system of claim 16, wherein the ADC is characterized as being a successive approximation register ADC.

18. The data processing system of claim 16, wherein the series of test codes are representative of a ramped signal having a slope determined by a step size between test codes of the series of test codes.

19. The data processing system of claim 16, wherein the data processing system is implemented on a single integrated circuit.

* * * * *